(12) United States Patent
Bal et al.

(10) Patent No.: US 9,513,566 B2
(45) Date of Patent: Dec. 6, 2016

(54) LITHOGRAPHIC APPARATUS

(71) Applicant: ASML Netherlands B.V., Veldhoven (NL)

(72) Inventors: Kursat Bal, Arnhem (NL); Bernardus Antonius Johannes Luttikhuis, Nuenen (NL); David Christopher Ockwell, Waalre (NL); Arnold Jan Van Putten, Eindhoven (NL); Han-Kwang Nienhuys, Utrecht (NL); Maikel Bernardus Theodorus Leenders, Veghel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/377,954

(22) PCT Filed: Feb. 28, 2013

(86) PCT No.: PCT/EP2013/054095
§ 371 (c)(1),
(2) Date: Aug. 11, 2014

(87) PCT Pub. No.: WO2013/135494
PCT Pub. Date: Sep. 19, 2013

(65) Prior Publication Data
US 2015/0049323 A1 Feb. 19, 2015

Related U.S. Application Data

(60) Provisional application No. 61/610,653, filed on Mar. 14, 2012.

(51) Int. Cl.
*G03B 27/32* (2006.01)
*G03B 27/52* (2006.01)
(Continued)

(52) U.S. Cl.
CPC ............. *G03F 7/70691* (2013.01); *G03F 7/20* (2013.01); *G03F 7/70066* (2013.01); *G03F 7/70866* (2013.01); *G03F 7/70933* (2013.01)

(58) Field of Classification Search
CPC .. G03F 7/20; G03F 7/70066; G03F 7/70691; G03F 7/70866; G03F 7/70908; G03F 7/70916; G03F 7/70933
USPC .................................. 355/30, 67, 71, 75, 77
See application file for complete search history.

(56) References Cited

U.S. PATENT DOCUMENTS

| 6,078,381 A * | 6/2000 | Suzuki ................ G03F 7/70066 355/53 |
| 6,934,003 B2 | 8/2005 | Hasegawa et al. |

(Continued)

FOREIGN PATENT DOCUMENTS

| CN | 1550905 A | 12/2004 |
| CN | 1637608 A | 7/2005 |

(Continued)

OTHER PUBLICATIONS

International Search Report directed to related International Patent Application No. PCT/EP2013/054095, mailed Nov. 22, 2013; 5 pages.

(Continued)

*Primary Examiner* — Colin Kreutzer
(74) *Attorney, Agent, or Firm* — Sterne, Kessler, Goldstein & Fox P.L.L.C.

(57) ABSTRACT

A lithographic apparatus injects gas between a reticle (MA) and reticle blades (REB-X, REB-Y) to protect the reticle from contamination. The gas may be injected either into the space defined between the reticle and the closest pair of reticle blades, or into the space defined between the two pairs of reticle blades.

19 Claims, 5 Drawing Sheets

(51) Int. Cl.
*G03B 27/62* (2006.01)
*G03F 7/20* (2006.01)

(56) References Cited

U.S. PATENT DOCUMENTS

| | | | |
|---|---|---|---|
| 7,352,434 | B2 | 4/2008 | Streefkerk et al. |
| 7,684,008 | B2 | 3/2010 | De Smit et al. |
| 2002/0145711 | A1* | 10/2002 | Magome ............ G03F 7/70858 355/30 |
| 2004/0211920 | A1 | 10/2004 | Maria Derksen et al. |
| 2005/0275835 | A1* | 12/2005 | Sogard ................. B82Y 10/00 356/237.2 |
| 2006/0007414 | A1* | 1/2006 | Luttikhuis .......... G03F 7/70841 355/30 |
| 2006/0017895 | A1 | 1/2006 | Sogard |
| 2007/0103656 | A1 | 5/2007 | Sogard |
| 2007/0209226 | A1 | 9/2007 | Coon |
| 2007/0285632 | A1 | 12/2007 | Phillips et al. |
| 2009/0135386 | A1* | 5/2009 | Nishikawa ......... G03F 7/70075 355/30 |

FOREIGN PATENT DOCUMENTS

| | | |
|---|---|---|
| CN | I01221373 A | 7/2008 |
| JP | 2003-234281 A | 8/2003 |
| JP | 2015-086133 A | 3/2005 |

OTHER PUBLICATIONS

International Preliminary Report on Patentability and Written Opinion of the International Searching Authority directed to related International Patent Application No. PCT/EP2013/054095, issued Sep. 16, 2014; 6 pages.

Second Chinese Office Action (with English language translation) directed to related Chinese Patent Application No. 201380013882.9, mailed Apr. 14, 2016; 9 pages.

English-Language Abstract for Japanese Patent Publication No. JP2015-086133A, published Mar. 31, 2005; 2 pages.

English-Language Abstract for Chinese Patent Publication No. CN101221373A, published Jul. 16, 2008; 1 page.

\* cited by examiner

LITHOGRAPHIC APPARATUS

CROSS-REFERENCE TO RELATED APPLICATIONS

This application claims the benefit of U.S. provisional application 61/610,653, which was filed on 14 Mar. 2012, and which is incorporated herein in its entirety by reference.

FIELD

The present invention relates to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as droplets of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source One known problem in EUV lithographic apparatus is contamination of the reticle. In a EUV lithographic apparatus purge gas flows at high speed towards the reticle and may carry molecules and particles up to micrometer sizes. In some apparatus a transparent membrane pellicle may be provided to protect the reticle, but this is less preferred because of the high EUV absorption it would cause. Molecular contamination of the reticle can be addressed by cleaning processes involving hydrogen radicals. However, this does not address particle contamination. Molecular contamination of the projection and illumination optics can be prevented or reduced by purging their vacuum environments with clean hydrogen gas. Typically, this results in a flow of hydrogen gas along the optical path towards the reticle. This flow may carry particles that can subsequently contaminate the reticle. Another known technique is to use a drag force inducted by a gas temperature gradient generated via thermophoresis but this is less desirable as the reticle has to be heated. Generally, it has been found that existing techniques do not completely remove the possibility of particle contamination from the reticle blades and other components located between the gas injection points and the reticle and may induce other problems such as reticle deformation due to a temperature gradient or gas fluctuations disturbing the EUV radiation intensity.

SUMMARY

According to an embodiment of the present invention there is provided an apparatus comprising: an illumination system configured to condition a radiation beam; a support structure constructed to support a patterning device, wherein the support structure comprises a part for receiving the first patterning device; a radiation beam shaping device spaced from the part for receiving the patterning device, whereby a confined space CS is defined between the part for receiving the patterning device and the radiation beam shaping device; and wherein the apparatus further comprises at least one gas supply means having a gas supply outlet located to supply gas to the confined space CS.

According to an embodiment of the present invention there is provided a lithographic apparatus comprising: an illumination system configured to condition a radiation beam, a support structure constructed to support a patterning device, a substrate table constructed to hold a substrate, and a projection system configured to project a pattern imparted to the radiation beam by the patterning device onto a target portion of the substrate. The patterning device comprises a reticle and at least one reticle masking blade spaced from the reticle whereby a space is defined between the masking blade and the reticle. The apparatus further comprises at least one gas supply means having a gas supply outlet located to supply gas to the space.

In one embodiment the apparatus comprises a first pair of blades adapted to move in a first direction, and a second pair of blades adapted to move in a second direction. The first pair of blades is located closer to the reticle than the second pair of blades. The gas supply outlet is located to supply gas to the space between the first pair of blades and the reticle.

In another embodiment the apparatus comprises a first pair of blades adapted to move in a first direction, and a second pair of blades adapted to move in a second direction. The first pair of blades is located closer to the reticle than the second pair of blades. The gas supply outlet is located to supply gas to the space between the first pair of blades and the second pair of blades.

In one example, the gas supply outlet is located at a distance of less than about 10 mm from a surface of the reticle facing the at least one masking blade.

In one example, there are a plurality of gas supply outlets which may be arranged on opposite sides of the reticle.

In a further embodiment the reticle is located within a first vacuum environment and flow resistance means are provided to restrict flow of gas from the space to the first vacuum environment. The gas flow rate Q (expressed in Pa m$^3$/s units) calculated for a given pressure difference Delta P is determined by Q=C*Delta P, where C is the conductance in m$^3$/s. The flow resistance may mean restricts the gas conductance to the first vacuum space to being less than 10 m$^3$/s, likely less than 5 m$^3$/s, or still less than 2 m$^3$/s.

In a still further embodiment the illumination system and the projection system are provided in respective vacuum environments, and the gas pressure adjacent the surface of the reticle is greater than the pressure of the respective vacuum environments. The respective vacuum environments may be defined by a separator, the separator having a sleeve open at one end towards the respective vacuum environments and open at another end towards the reticle. The sleeve may taper towards the reticle.

According to another aspect of the present invention there is provided a lithographic apparatus comprising: an illumination system configured to condition a radiation beam, a support structure constructed to support a patterning device, a substrate table constructed to hold a substrate, and a projection system configured to project a pattern imparted to the radiation beam by the patterning device onto a target portion of the substrate. The apparatus further comprises at least one gas supply having a gas supply outlet located no more than 10 mm from a surface of the patterning device.

According to another aspect of the present invention there is provided a method comprising: generating a beam of radiation with an illumination system, patterning the beam of radiation with patterning device, and projecting the patterned beam of radiation onto a substrate with a projection system. The patterning device comprises a reticle with at least one reticle masking blade defining a space between the reticle and the reticle masking blade. The method further comprises supplying a gas to the space.

In one example, the gas is supplied in a direction parallel to the surface of the reticle, e.g., from two sides of the reticle.

In an even further embodiment there is a first pair of blades adapted to move in a first direction, and a second pair of blades adapted to move in a second direction. The first pair of blades is located closer to the reticle than the second pair of blades. The gas is supplied to the space between the first pair of blades and the reticle.

In another embodiment device there is a first pair of blades adapted to move in a first direction, and a second pair of blades adapted to move in a second direction. The first pair of blades is located closer to the reticle than the second pair of blades. The gas is supplied to the space between the first pair of blades and the second pair of blades.

In one example, a reticle is located within a first vacuum environment and the method comprises restricting flow of gas from the space to the first vacuum environment. Desirable the flow of gas to the first vacuum space is restricted such that the gas conductance is less than 10 m$^3$/s, less than 5 m$^3$/s, or still less than 2 m$^3$/s.

In one example, a method further comprises providing the illumination system and the projection system in respective vacuum environments, and maintaining the gas pressure adjacent the surface of the reticle greater than the pressure of the respective vacuum environments. The respective vacuum environments may be defined by a separator, the separator having a sleeve open at one end towards the respective vacuum environments and open at another end towards the reticle. The sleeve may taper towards the reticle.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts a lithographic apparatus according to an embodiment of the invention.

Figure 1:
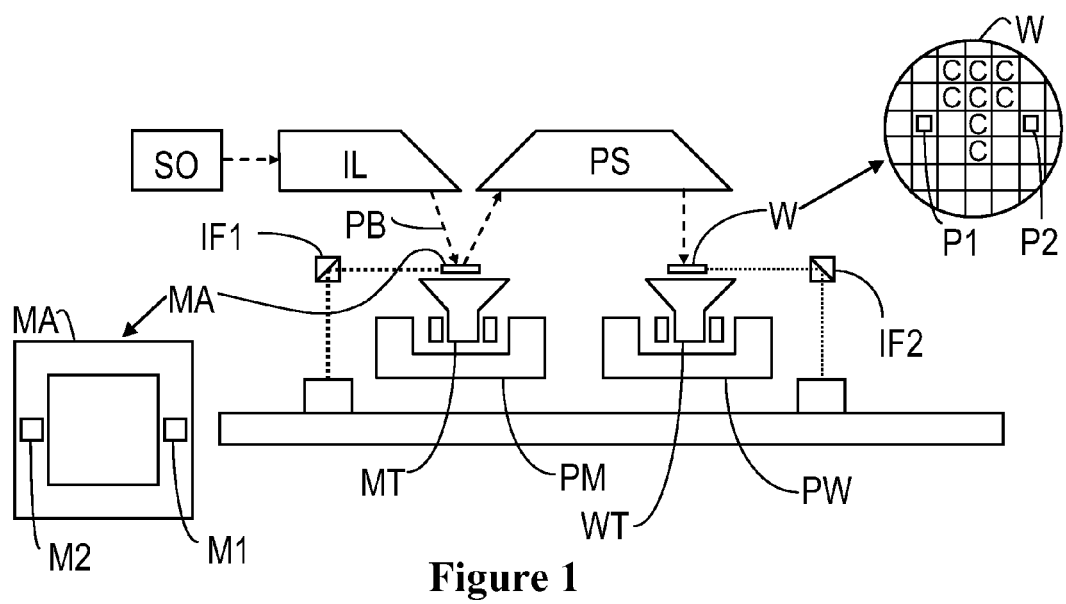

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically shows a lithographic apparatus LAP including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam PB by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT comprises a part for receiving and holding the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum vessel and vacuum pumps.

As here depicted, the apparatus is of a reflective type (i.e., employing a reflective mask and reflective optics in the illuminator IL and projection system PS The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an EUV radiation beam from the EUV source SO. Methods to produce EUV radiation include, but are not necessarily limited to, converting a material into a plasma state that has at least one chemical element, e.g., xenon, lithium, or tin, with one or more emission lines in the EUV range. In one such method, often termed laser-produced plasma ("LPP"), the required plasma can be produced by irradiating a fuel, such as a droplet of material having the required line-emitting element, with a laser beam. The EUV source SO may be part of an EUV radiation source including a laser, not shown in FIG. 1, for providing the laser beam exciting the fuel. The resulting plasma emits output radiation, e.g., EUV radiation, which is collected using a radiation collector, disposed in the EUV source.

The laser and the EUV source may be separate entities, for example when a $CO_2$ laser is used to provide the laser beam for fuel excitation. In such cases, the radiation beam is passed from the laser to the EUV source with the aid of a beam delivery system comprising, for example, suitable directing mirrors and/or a beam expander. The laser and a fuel supply may be considered to comprise an EUV radiation source.

The illuminator IL may comprise an adjuster for adjusting the angular intensity distribution of the radiation beam. Generally, at least the outer and/or inner radial extent (commonly referred to as σ-outer and σ-inner, respectively)

of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam PB is incident on the patterning device (e.g., mask) MA, which is held on the support structure (e.g., mask table) MT, and is patterned by the patterning device. The patterning device MA may be positioned using first positioning device such as interferometer IF1 and mask alignment marks M1,M2. After being reflected from the patterning device (e.g., mask) MA, the patterned radiation beam PB passes through the projection system PS, which focuses the beam onto a target portion C of the substrate W. With the aid of the second positioning device such as interferometer IF2 and substrate alignment marks P1, P2 (e.g., using interferometric devices, linear encoders or capacitive sensors), the substrate table WT can be moved accurately, e.g., so as to position different target portions C in the path of the radiation beam PB.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Figure 2:
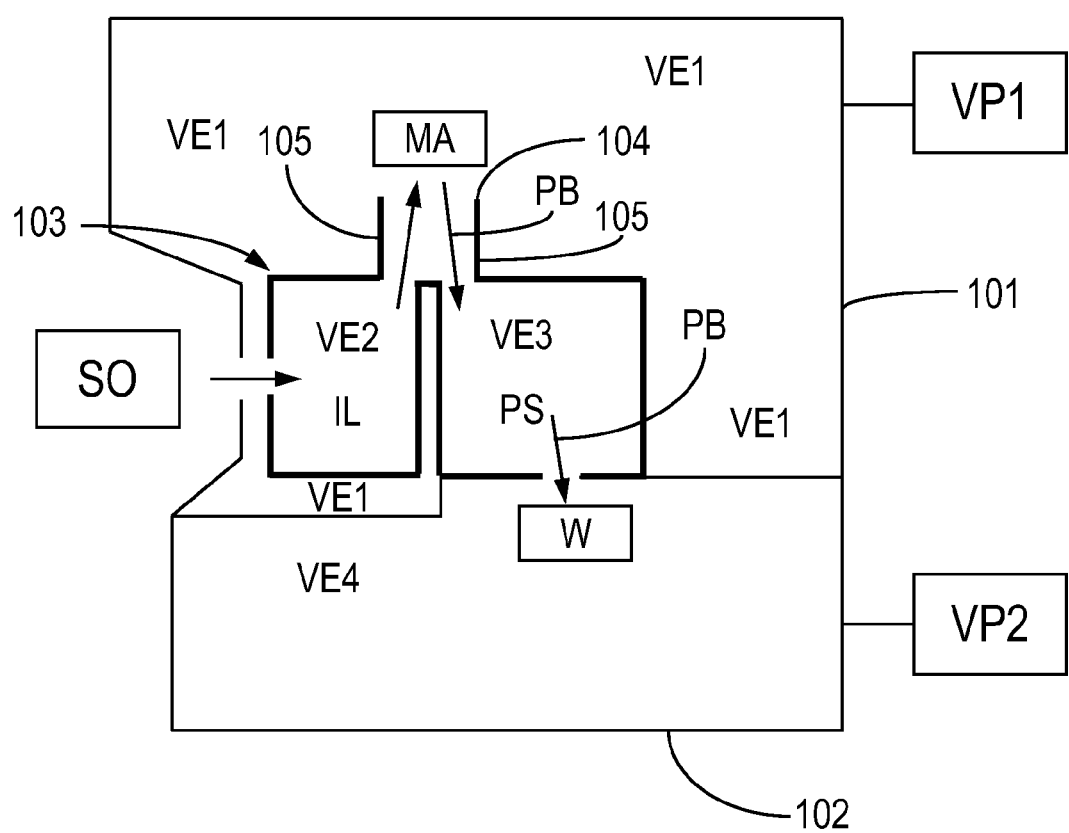
FIG. 2 is a schematic view of an embodiment of the present invention showing in particular pressure zones of a lithographic apparatus.
Figure 3:
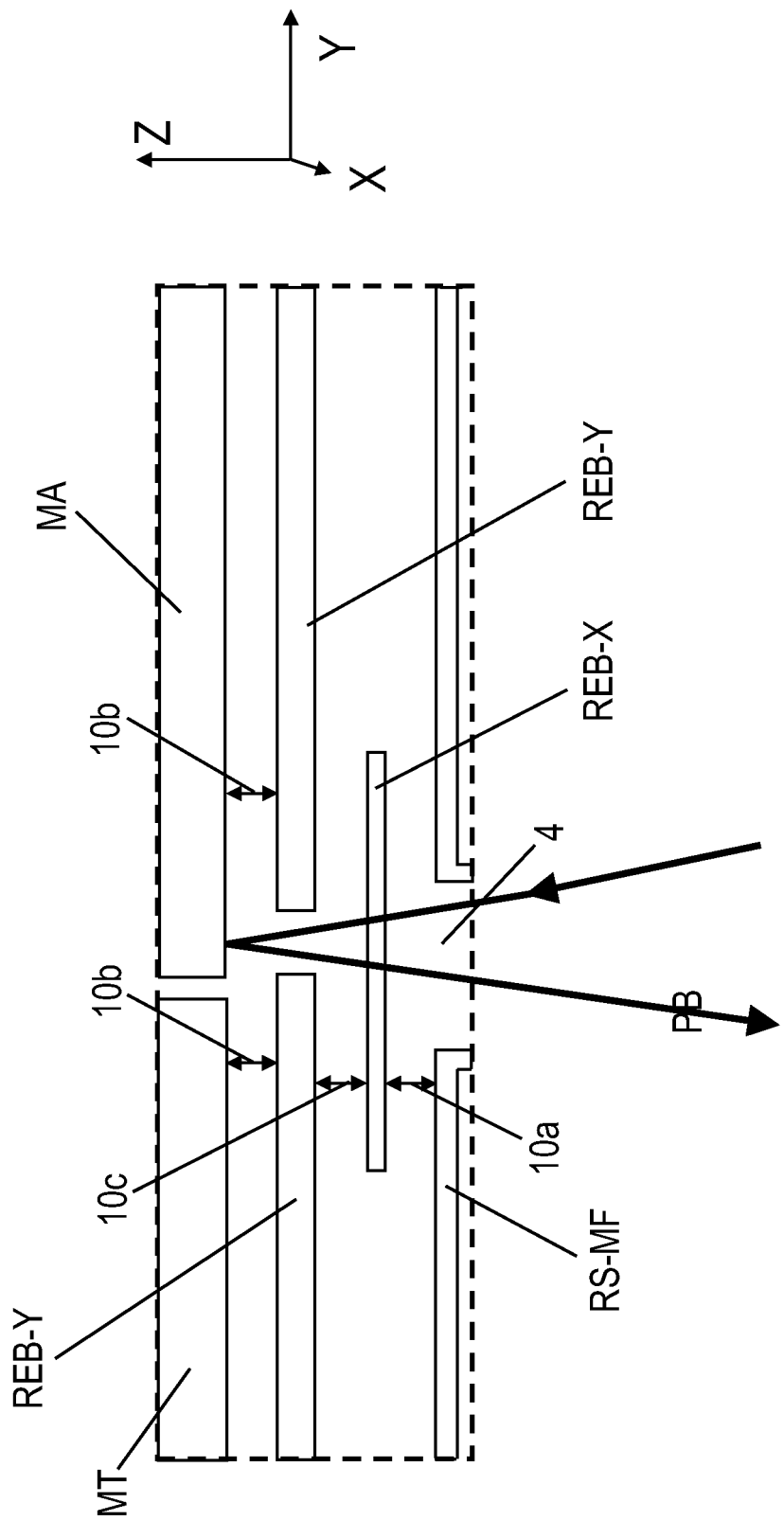
FIG. 3 shows in side view a detail of the embodiment of FIG. 2.
Figure 4:
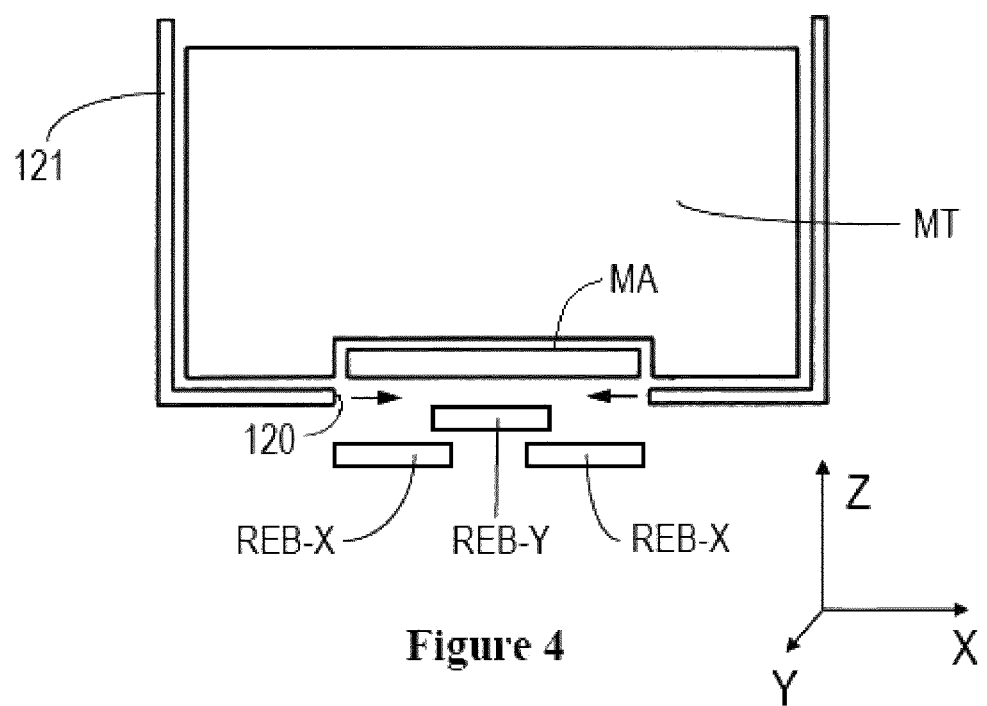
FIG. 4 shows a further side view detail of the embodiment of FIG. 2 showing the reticle assembly and masking blades according to an embodiment of the invention in side view.
Figure 5:
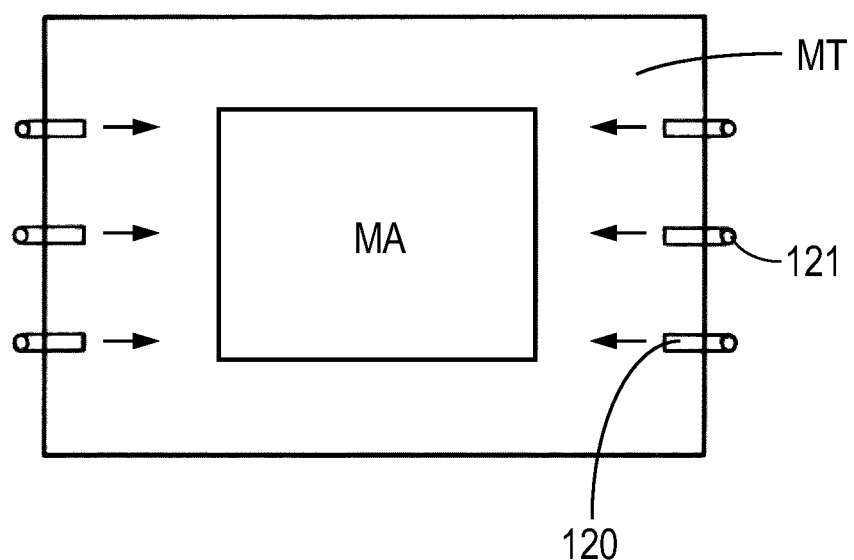
FIG. 5 shows the reticle assembly and masking blades according to an embodiment of the invention in plan view.

FIG. 2 schematically shows an apparatus according to an embodiment of the present invention. FIGS. 3 to 5 show parts of this embodiment in more detail. The apparatus of FIG. 2 includes a first chamber 101 that contains an illumination system IL as well as a projection system PS. The illumination system IL is configured to condition a radiation beam received from source SO, and the projection system PS is configured to project a patterned radiation beam PB onto a target portion of a substrate W. First chamber 101 also contains a reticle support constructed to support the reticle MA, the reticle MA being capable of imparting a radiation beam with a pattern in its cross-section to form the patterned radiation beam. A second chamber 102 contains the wafer stage of which for clarity only the substrate W is shown.

FIG. 2 shows how the apparatus may be divided into four different vacuum environments VE1 to VE4. First chamber 101 define a first vacuum environment VE1 that encloses the reticle stage of which for clarity only the reticle MA is shown. First chamber 101 also includes a separator construction 103 that defines two further vacuum environments: VE2 housing the illumination system IL, and VE3 housing the projection system PS. Vacuum environments VE2 and VE3 could be further divided. Separator construction 103 includes a sleeve 105 having an aperture 104 for passing the projection beam PB from the illumination system IL to reticle MA, and for passing the patterned radiation beam from reticle MA to the projection system PS. The sleeve 105 also serves to force the gas flow downwards (ie away from the reticle) and to maintain the gas flow even to avoid disturbance of the EUV radiation intensity. Possibly the sleeve may taper towards the reticle MA. Second chamber 102 defines a vacuum environment VE4 that the wafer stage (of which for clarity only substrate W is shown). Vacuum environments VE1 and VE2 are formed and maintained by respective vacuum vessels and vacuum pumps VP1 and VP2, which can also be a plurality of vacuum pumps.

As is shown in FIG. 2 vacuum pump VP1 maintains vacuum environment VE1 at a lower pressure than vacuum environments VE2 and VE3. Clean gas (e.g., hydrogen, helium, nitrogen, oxygen or argon) is injected into vacuum environments VE2 and VE3 using gas injectors (not shown). The vacuum pumps VP1, VP2 as such are known to the skilled person, and may be coupled to the apparatus in various ways.

The separator construction 103 can be arranged in various ways, and may include, for example, a sleeve 105 extending towards the reticle MA at the end of which sleeve 105 is provided the projection beam aperture 104 extend towards the reticle MA. In the present embodiment, the sleeve 105 bearing the aperture 104 may have a tapered cross-section.

In an embodiment, the apparatus also includes a radiation beam shaping device comprising reticle masking blades REB for controlling the dimensions of the projection beam PB. As shown in FIG. 4 such blades REB extend at least partially between the patterning device MA and the aperture 104 of the separator construction 103 during use.

FIG. 3 schematically shows the mask table MT holding the patterning device MA, and blades REB-X and blades REB-Y which are located near the reticle MA for controlling the shape of the projection beam in the X and Y directions, respectively. In the present embodiment, the Y-blades REB-Y are positioned nearer to the reticle MA than the X-blades REB-X, when viewed in the Z-direction but of course the blades could be arranged the other way around. The reticle stage metrology frame RS-MF is provided with an aperture 4 for allowing the radiation beam to reach and be reflected by the patterning device MA.

The X-blades REB-X are located at a small distance 10a from the projection beam aperture 4 measured in the Z-direction. This last-mentioned distance is not more than about 5 mm, and not more than about 2 mm.

Also, the Y-blades REB-Y are located at small distances 10b from the reticle MA. The last-mentioned distance is also no more than about 5 mm, measured in the Z-direction.

The smallest distance 10c between the X-blades and Y-blades may be about 5 mm, when measured in the Z-direction.

FIGS. 4 and 5 show respectively schematic side and plan views of the reticle assembly in more detail showing an embodiment of the invention. As shown in FIG. 4 gas injection means comprising gas supply conduits 121 having respective gas outlets 120 are provided on either side of the reticle MA and are arranged such that gas (in particular hydrogen, helium, nitrogen, oxygen or argon) may be injected in a direction parallel to the surface of the reticle MA, in the direction of the arrows in the figure, and substantially in the space between the reticle MA and the blades REB-X, REB-Y. By injecting gas close to the reticle surface and in particular into the confined space between the reticle surface and the blades the possibility of contamination from components such as the blades themselves and other components is substantially reduced. It may further also be advantageous to provide the support structure for holding the patterning device in a partially enclosed environment, at least in the vicinity of the confined space between the reticle surface and the blades. In such configuration an even more effective gas transport towards the projection optics compartment may be achieved due to the pressure created in the partially enclosed environment.

In an embodiment one or more gas supply conduits are provided coupled to the support structure. For example, the gas supply conduits are provided such that they extend downwards through the support structure MT at a vertical direction (i.e., in the z direction) or at an inclination defining an angle with the z direction. The outlets of the gas supply conduits are preferably oriented towards the reticle surface, for example horizontally (i.e., in the X-Y plane). FIG. 5 shows in particular three gas outlets 120 which are provided equispaced on each lateral side of the reticle. Gas supply conduits 121 are provided that extend vertically (i.e., in the z direction) through the reticle assembly with the outlets of the gas supply conduits being oriented horizontally (i.e., in the X-Y plane) such that hydrogen gas is supplied parallel to the surface of the reticle MA in the space between the reticle MA and the blades REB-Y. It will be understood that other numbers of gas supply conduits and other arrangements may be provided that achieve the same objective of supplying gas in a direction parallel to the surface of the reticle MA and between the reticle and the blades. However, the gas supply conduits are formed as part of the reticle stage so that they move with the reticle stage even in large movements of the reticle.

For example, the gas could be injected in the X direction, or in the Y direction (as shown in the Figures the gas is injected in the X direction). The gas is injected in the X direction because in this case the conduits 121 interfere less with the movement of the reticle stage. The gas is injected between the blades that are closest to the reticle (in this case the REB-Y blades), but could be injected between the REB-Y and the REB-X blades. In general terms, the gas conduits are located no more than about 10 mm from the surface of the reticle MA.

It is advantageous to ensure that outgassing from the reticle MA does not result in the generation of excessive amounts of molecular contaminants that may be carried through into the illuminator IL and the projection system PS since some of the gas supplied via the conduits may flow into the illuminator (IL) and into the projection system (PS).

In order to minimise the possibility of particle contamination of the reticle MA it is advantageous if the pressure at the reticle MA is higher than in both VE2 and VE3 so that there is a downward flow from MA into VE2 and VE3. This may be achieved by balancing the flow rates that are injected into the different environments, i.e., the flow rates of the gas injections into VE2 and VE3 and the gas injected from the conduits 121. Also desirable is to have a high flow resistance from the reticle MA into the remainder of VE1 and this may be obtained by providing a flow resistance means between the reticle MA and the environment VE1 such that the gas conductance between the reticle MA and the environment VE1 is no more than 10 m$^3$/s, no more than 5 m$^3$/s and still no more than 2 m$^3$/s.

Methods of implementing such a flow resistance include extending a top surface of the separator in the X-Y plane parallel to the reticle MA, extending the surface of the reticle support structure MT in the X-Y plane, or forming protrusions on at least some of the reticle blades REB such protrusions extending in the Z-direction (i.e., towards or away from the reticle MA, or both).

Combinations and/or variations on the above described modes of use or entirely different modes of use may also be employed.

Although the above embodiments where described in connection with a lithographic apparatus, the same concept may also be used for other types of apparatus, such as a metrology apparatus or an inspection apparatus for measuring properties of a surface, for example to measure properties of a surface of a patterned substrate.

Such a metrology or inspection apparatus may comprise for example several of the following elements: an optical system arranged to condition a property of a radiation beam for illuminating a substrate to be analysed, a support structure comprising a part constructed to support the substrate to be analysed, a radiation beam shaping device for shaping the radiation beam, the radiation beam shaping device being provided adjacent the support structure, at least one gas supply means having a gas supply outlet located to supply gas to a confined space between the part of the support structure constructed to support the substrate to be analysed and the radiation beam shaping device, and a processor arrange to analyze the detected radiation. A radiation source arranged to illuminate the substrate to be analysed may be provided as an integral part of said apparatus or as a separate component to be used together with the metrology or inspection apparatus.

Herein by "a confined space CS" it is meant a limited space which is defined between a) the part of the support structure constructed to support the patterning device, and b) the radiation shaping device (i.e. the case of the apparatus not in use, when the patterning device is not supported by the support structure). By "a confined space CS'" it is meant the limited space between the patterning device and the radiation shaping device (i.e. the case of the apparatus in use, when the patterning device is supported by the support structure), such as the confined space between the surfaces of a reticle MA supported by the support structure and of at least one of the masking blades.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LED's, solar cells, photonic devices, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and clauses and their equivalents.

1. A lithographic apparatus comprising:
   an illumination system configured to condition a radiation beam,
   a support structure configured to support a patterning device,
   a substrate table configured to hold a substrate,
   a projection system configured to project a pattern imparted to the radiation beam by the patterning device onto a target portion of the substrate, wherein the patterning device comprises a reticle and at least one reticle masking blade spaced from the reticle whereby a space is defined between the masking blade and the reticle, and at least one gas supply having a gas supply outlet configured to supply gas to the space.

2. The lithographic apparatus of clause 1, further comprising:
   a first pair of blades adapted to move in a first direction; and
   a second pair of blades adapted to move in a second direction,
   wherein the first pair of blades is located closer to the reticle than the second pair of blades, and
   wherein the gas supply outlet is located to supply gas to the space between the first pair of blades and the reticle, 3. The lithographic apparatus of clause 1, further comprising:
   a first pair of blades adapted to move in a first direction, and
   a second pair of blades adapted to move in a second direction,
   wherein the first pair of blades is located closer to the reticle than the second pair of blades, and
   wherein the gas supply outlet is located to supply gas to the space between the first pair of blades and the second pair of blades.

4. The lithographic apparatus of clause 1, wherein the gas supply outlet is located at a distance of less than about 10 mm from a surface of the reticle facing the at least one masking blade.

5. The lithographic apparatus of clause 1, further comprising a plurality of the gas supply outlets.

6. The lithographic apparatus of clause 5, wherein the gas supply conduits are arranged on opposite sides of the reticle.

7. The lithographic apparatus of clause 1, wherein:
   the reticle is located within a first vacuum environment, and
   a flow resistance device is provided to restrict flow of gas from the space to the first vacuum environment.

8. The lithographic apparatus of clause 7, wherein the flow resistance device restrict the gas conductance to the first vacuum space to being less than about 10 m$^3$/s.

9. The lithographic apparatus of clause 8, wherein the flow resistance device restricts the gas conductance to the first vacuum space to being less than about 5 m$^3$/s.

10. The lithographic apparatus of clause 9, wherein the flow resistance device restricts the gas conductance to the first vacuum space to being less than about 2 m$^3$/s.

11. The lithographic apparatus of clause 1, wherein:
    the illumination system and the projection system are provided in respective vacuum environments, and
    the gas pressure adjacent the surface of the reticle is greater than the pressure of the respective vacuum environments.

12. The lithographic apparatus of clause 11, further comprising:
    a separator configured to define the respective vacuum environments, the separator having a sleeve open at one end towards the respective vacuum environments and open at another end towards the reticle.

13. The lithographic apparatus of clause 12, wherein the sleeve tapers towards the reticle.

14. A lithographic apparatus comprising:
    an illumination system configured to condition a radiation beam,
    a support structure configured to support a patterning device,
    a substrate table configured to hold a substrate,
    a projection system configured to project a pattern imparted to the radiation beam by the patterning device onto a target portion of the substrate,
    at least one gas supply having a gas supply outlet located no more than 10 mm from a surface of the patterning device.

15. A method comprising:
    generating a beam of radiation with an illumination system,
    patterning the beam of radiation with patterning device, the patterning device comprises a reticle with at least one reticle masking blade defining a space between the reticle and the reticle masking blade,
supplying a gas to the space, and
projecting the patterned beam of radiation onto a substrate with a projection system.
16. The method of clause 15, wherein the supplying comprises supplying gas in a direction parallel to the surface of the reticle.
17. The method of clause 15, wherein the gas is supplied from two sides of the reticle.
18. The method of clause 15, further comprising:
moving a first pair of blades in a first direction, and
moving a second pair of blades is adapted to move in a second direction,
wherein the first pair of blades is located closer to the reticle than the second pair of blades, and
wherein the gas is supplied to the space between the first pair of blades and the reticle.
19. The method of clause 15, further comprising:
moving a first pair of blades in a first direction, and
moving a second pair of blades in a second direction,
wherein the first pair of blades is located closer to the reticle than the second pair of blades, and
wherein the gas is supplied to the space between the first pair of blades and the second pair of blades.
20. The method of clause 15, wherein the reticle is located within a first vacuum environment and wherein the method further comprises restricting flow of gas from the space to the first vacuum environment.
21. The method of clause 20 comprising restricting the gas conductance to the first vacuum space to being less than about 10 m$^3$/s.
22. The method of clause 15, further comprising providing the illumination system and the projection system in respective vacuum environments, and maintaining the gas pressure adjacent the surface of the reticle greater than the pressure of the respective vacuum environments.
23. The method of clause 15 further comprising defining the respective vacuum environments by means of separator means, the separator means having a sleeve open at one end towards the respective vacuum environments and open at another end towards the reticle.
24. The method of clause 23 wherein the sleeve tapers towards the reticle.

The invention claimed is:
1. An apparatus comprising:
an illumination system configured to condition a radiation beam;
a support structure configured to support a patterning device, wherein the support structure comprises a part configured to receive the patterning device;
a radiation beam shaping device spaced from the part, wherein the radiation beam shaping device is a patterning device masking blade configured to control dimensions of the radiation beam, wherein a confined space is defined between the part and the patterning device masking blade;
a gas supply having a gas supply outlet configured to supply gas to the confined space and being oriented towards the patterning device, such that in use the gas supply outlet injects gas in a direction parallel to a surface of the patterning device
a projection system configured to project a pattern imparted to the radiation beam by the patterning device onto a target portion of a substrate, wherein the illumination system and the projection system are provided in respective vacuum environments, and wherein a gas pressure adjacent a surface of the patterning device is greater than a gas pressure of the respective vacuum environments; and
a separator configured to define the respective vacuum environments, the separator comprising a sleeve that extends from the respective vacuum environments toward the patterning device, the sleeve being configured to force the gas away from the patterning device.
2. The apparatus of claim 1, further comprising:
a substrate table configured to hold the substrate.
3. The apparatus of claim 2, wherein:
the patterning device comprises a reticle,
a second confined space is defined between the patterning device masking blade and the patterning device, and
the gas supply outlet is configured to supply gas to the second confined space.
4. The apparatus of claim 3, further comprising:
a first pair of blades configured to move in a first direction and a second pair of blades configured to move in a second direction, wherein the first pair of blades is located closer to the patterning device than the second pair of blades and the gas supply outlet is configured to supply gas to a space between the first pair of blades and the patterning device.
5. The apparatus of claim 3, further comprising:
a first pair of blades configured to move in a first direction and a second pair of blades adapted to move in a second direction, wherein the first pair of blades is located closer to the patterning device than the second pair of blades and the gas supply outlet is configured to supply gas to a space between the first pair of blades and the second pair of blades.
6. The apparatus of claim 3, wherein the gas supply outlet is located at a distance of less than about 10 mm from a surface of the patterning device facing the patterning device masking blade.
7. The apparatus of claim 3, comprising a plurality of gas supply outlets.
8. The apparatus of claim 7, wherein the gas supply conduits are arranged on opposite sides of the patterning device.
9. The apparatus of claim 3, wherein:
the patterning device is located within a first vacuum environment; and
a flow resistance is provided to restrict flow of the gas from the patterning device to the first vacuum environment.
10. The apparatus of claim 9, wherein the flow resistance restricts gas conductance to the vacuum space to being less than 10 m$^3$/s.
11. The apparatus of claim 1,
wherein the sleeve is open at one end towards the respective vacuum environments and is open at another end towards the patterning device, and wherein the sleeve tapers towards the patterning device.
12. The apparatus of claim 1, wherein the gas supply is coupled to the support structure and in use, the gas supply outlet of moves with the patterning device when the patterning device moves.
13. A method comprising:
generating a beam of radiation with an illumination system;
patterning the beam of radiation with a patterning device, wherein the patterning device comprises a reticle with a patterning device masking blade defining a space between the patterning device and the patterning device masking blade;

projecting the patterned beam of radiation onto a substrate with a projection system; and supplying a gas to the space in a direction parallel to the surface of the patterning device and from two sides of the patterning device.

14. The method of claim 13, wherein a first pair of blades is configured to move in a first direction and a second pair of blades is configured to move in a second direction, and the first pair of blades is located closer to the patterning device than the second pair of blades, and the supplying the gas further comprises:

supplying the gas to a space between the first pair of blades and the patterning device.

15. The method of claim 13, wherein a first pair of blades is configured to move in a first direction and a second pair of blades is configured to move in a second direction, and the first pair of blades is located closer to the patterning device than the second pair of blades, and the supplying the gas further comprises:

supplying the gas to a space between the first pair of blades and the second pair of blades.

16. The method of claim 13, wherein the patterning device is located within a first vacuum environment and wherein the method further comprises:

restricting flow of gas from the space to the first vacuum environment.

17. The method of claim 13, further comprising:

providing the illumination system and the projection system in respective vacuum environments, and maintaining a gas pressure adjacent the surface of the patterning device greater than a pressure of the respective vacuum environments.

18. The method of claim 17, further comprising:

defining the respective vacuum environments by a separator having a sleeve open at one end towards the respective vacuum environments and open at another end towards the patterning device.

19. An apparatus comprising:

an illumination system configured to condition a radiation beam;

a support structure configured to support a patterning device, wherein the support structure comprises a part configured to receive the patterning device;

a radiation beam shaping device spaced from the part, wherein the radiation beam shaping device is a patterning device masking blade configured to control dimensions of the radiation beam, and wherein a confined space is defined between the part and the patterning device masking blade; and a gas supply comprising a gas supply outlet configured to supply gas to the confined space and oriented towards the patterning device, such that in use the gas supply outlet injects gas in a direction parallel to a surface of the patterning device, wherein the gas supply is coupled to the support structure.

* * * * *